(12) United States Patent
Lee et al.

(10) Patent No.: US 7,504,855 B1
(45) Date of Patent: *Mar. 17, 2009

(54) MULTIPLE DATA RATE MEMORY INTERFACE ARCHITECTURE

(75) Inventors: Andy L. Lee, San Jose, CA (US); Brian D. Johnson, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/672,438

(22) Filed: Feb. 7, 2007

Related U.S. Application Data

(63) Continuation of application No. 10/857,396, filed on May 27, 2004, now Pat. No. 7,176,714.

(51) Int. Cl.
*H03K 19/173* (2006.01)
*G11C 7/00* (2006.01)

(52) U.S. Cl. ........................................ 326/38; 365/193

(58) Field of Classification Search ............. 326/38–39; 365/193
See application file for complete search history.

(56) References Cited

U.S. PATENT DOCUMENTS

| | | | |
|---|---|---|---|
| 6,279,073 B1 * | 8/2001 | McCracken et al. | 711/105 |
| 6,742,098 B1 * | 5/2004 | Halbert et al. | 711/172 |
| 6,806,733 B1 * | 10/2004 | Pan et al. | 326/41 |
| 6,894,531 B1 * | 5/2005 | Nouban et al. | 326/38 |
| 7,176,714 B1 * | 2/2007 | Lee et al. | 326/38 |
| 7,234,069 B1 * | 6/2007 | Johnson | 713/400 |

* cited by examiner

*Primary Examiner*—Rexford Barnie
*Assistant Examiner*—Jason Crawford
(74) *Attorney, Agent, or Firm*—Townsend and Townsend and Crew LLP

(57) ABSTRACT

The present invention provides a DQS bus for implementing high speed multiple-data-rate interface architectures in programmable logic devices. The DQS bus has a balanced tree structure between at least one data strobe circuit and a plurality of I/O register blocks.

20 Claims, 9 Drawing Sheets

MULTIPLE DATA RATE MEMORY INTERFACE ARCHITECTURE

This application is a continuation of U.S. patent application Ser. No. 10/857,396, filed May 27, 2004, now U.S. Pat. No. 7,176,714, issued Feb. 13, 2007.

BACKGROUND OF THE INVENTION

The present invention relates in general to input/output (I/O) interface architectures in integrated circuits, and in particular to methods and circuitry for distributing data strobe signals in a programmable logic device (PLD) that employs a multiple data rate memory interface.

Typical I/O architectures transmit a single data word on each positive clock edge and are limited to the speed of the clock signal. To address the problem of data bandwidth bottleneck between integrated circuits, high speed interface mechanisms have been developed to increase the speed of data transfer and data throughput. In a multiple data rate (MDR) interface scheme, two or more data words are transferred during each clock period. For example, in a double data rate (DDR) interface scheme, data is captured on both a rising edge and a falling edge of the clock to achieve twice the throughput of data. Multiple data rate technologies have thus accelerated the I/O performance of integrated circuits for a wide array of applications from computers to communication systems. For example, the MDR technologies are being employed in today's memory interfaces including interfaces for the double data rate synchronous dynamic random access memory (DDR SDRAM), fast cycle random access memory (FCRAM), reduced latency dynamic random access memory (DRAM I or RLDRAM I or RLDRAM II), and quadruple data rate static random access memory (QDR) as well as other high-speed interface standards.

Programmable logic devices (PLD) have been used to implement memory interface controllers for memory interfaces such as the DDR, QDR, or RLDRAM interfaces. The ability to modify the design on-the-fly to meet difficult memory interface timing requirements and the flexibility of programmable logic in customizing features of the memory interface controller are two of the primary advantages of using programmable logic in these applications.

An important feature of PLD's is package migration, which allows different members of a given PLD family to be interchanged on a given circuit board. This feature is useful for circuit designers because, as their design matures, they can choose any of a family of PLD's with different densities for a given socket on the circuit board. Another desirable feature of the PLD's, when used as memory controllers, is the ability to support memory devices having different speeds, different data bus widths, different data group sizes, and different timing requirements. On the other hand, high performance off-chip memories have such stringent timing requirements that it has been a challenge to design a PLD to interface with high performance off-chip memories while preserving the package migration feature and the ability to support memory devices having different speeds, data bus widths, and data group sizes. For example, the most recent high-performance off-chip memory standards, such as the RLDRAM II, have such stringent timing requirements that existing PLDs cannot interface with them.

Thus, as support for faster memory interfaces is adopted in PLD's, timing margins for meeting the memory interface requirements are becoming tighter, and it is becoming more important to reduce skew components. For example, in a basic DDR implementation, a clock signal (DQS) functions as a data strobe for controlling the timing of the transfer of I/O data (also referred to as DQ signals). During a read operation, each DQS signal comes to a PLD with a group of DQ signals. The DQS signal arrives at a DQS pin of the PLD and is phase-corrected before it is routed to a plurality of I/O registers for capturing the group of DQ signals. One of the skew components in the PID is the difference in arrival time between DQS and DQ at the I/O registers. Also, the arrival time of the DQS signal relative to each of the group of DQ signals may also be different. To illustrate the problem, FIG. 1 shows a DQS bus 110 driven by a DQS bus driver 105, which produces at the driver a phase-corrected version of the DQS signal. The DQS bus 110 routes the phase-corrected DQS to the plurality of I/O registers 120 for capturing the group of DQ signals. Since the DQS bus 110 is implemented as a single metal track that stretches across all of the plurality of I/O registers 120 for capturing the group of DQ signals, it introduces skew along the bus because the I/O registers closer to the DQS bus driver 105 will receive the phase-corrected DQS signal sooner than the I/O registers farther away from the DQS bus driver 105. The skew becomes worse as the group of DQ signals (i.e. the number of I/O registers 120) gets larger, such as a 32-bit data group. Therefore, for improved timing accuracy, it is desirable to minimize the skew between DQS and DQ signals as much as possible.

SUMMARY OF THE INVENTION

The present invention provides a DQS bus for implementing high speed multiple-data-rate interface architectures in programmable logic devices. The DQS bus has a balanced tree structure between at least one data strobe circuit and a plurality of I/O register blocks. In one embodiment of the present invention, the plurality of I/O register blocks are grouped into multiple groups of I/O register blocks and each group of I/O register blocks is coupled to a first interconnect line, which is connected to the data strobe circuit through a second interconnect line. The second interconnect line is connected to a third interconnect line through a mid-point of the second interconnect line. The balanced tree structure is configured such that lengths of signal paths from the strobe circuit to the mid-points of multiple tracks of the first interconnect lines are about equal.

In another embodiment of the invention, the DQS bus is a configurable balanced tree network between multiple strobe circuits and a plurality of register blocks. The register blocks are grouped into multiple groups of register blocks and each group of register blocks are coupled to one of a first set of selection devices, which can be programmed to select one of at least two strobe circuits for providing data strobe signals to the group of register blocks. Each of the first set of selection devices has multiple inputs and wherein a first one of the multiple inputs is connected to a respective one of the plurality of strobe circuits. The configurable balanced tree network is configured such that when one strobe circuit is selected to provide strobe signals to more than one groups of register blocks, lengths of signal paths from the strobe circuit to the selection devices coupled to the more than one groups of register blocks are about equal.

In yet another embodiment of the present invention, the DQS bus further includes a second set of selection devices. Each of the second set of selection devices has multiple inputs. A first input of each of the second set of selection devices is connected to a respective one of the plurality of strobe circuits. The second input of the respective one of the second set of selection devices is either driven to a static value (such as $V_{CC}$ or $V_{SS}$) or connected to an output of a different one of the second set of selection devices. A output of at least one of the second set of selection devices is coupled to inputs of more than one of the first set of selection devices. Again, the configurable balanced tree network is configured such that when one strobe circuit is selected to provide strobe signals to more than one groups of register blocks, lengths of signal paths from the strobe circuit to the selection devices coupled to the more than one groups of register blocks are about equal.

Thus, the DQS bus can be configured to accommodate different data widths by programming the selection devices.

DETAILED DESCRIPTION OF THE INVENTION

To minimize skew and to accommodate memories having different data bus widths and data group sizes, the present invention provides a modular multiple-data-rate memory I/O architecture having a balanced configurable tree structure that can be readily replicated and scaled. For illustrative purposes, the invention is described in the context of a double-data rate (DDR) system. It is to be understood, however, that the principles of this invention can be applied to a variety of multiple data rate systems.

Figure 1:
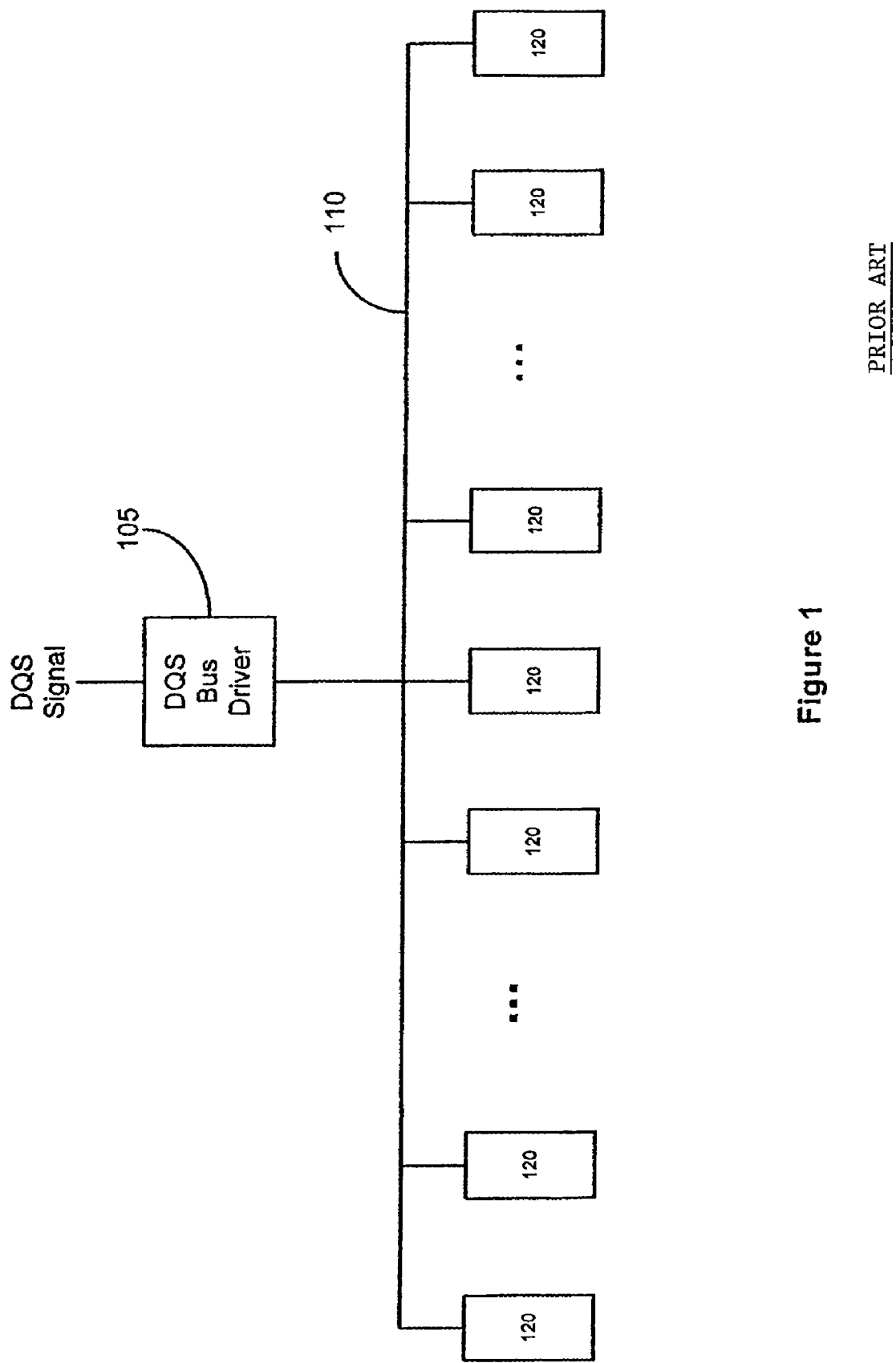
FIG. 1 is a block diagram of a prior art DQS bus for routing a phase-corrected memory interface read strobe (DQS) to a number of I/O registers within a data group associated with the DQS.
Figure 2B:
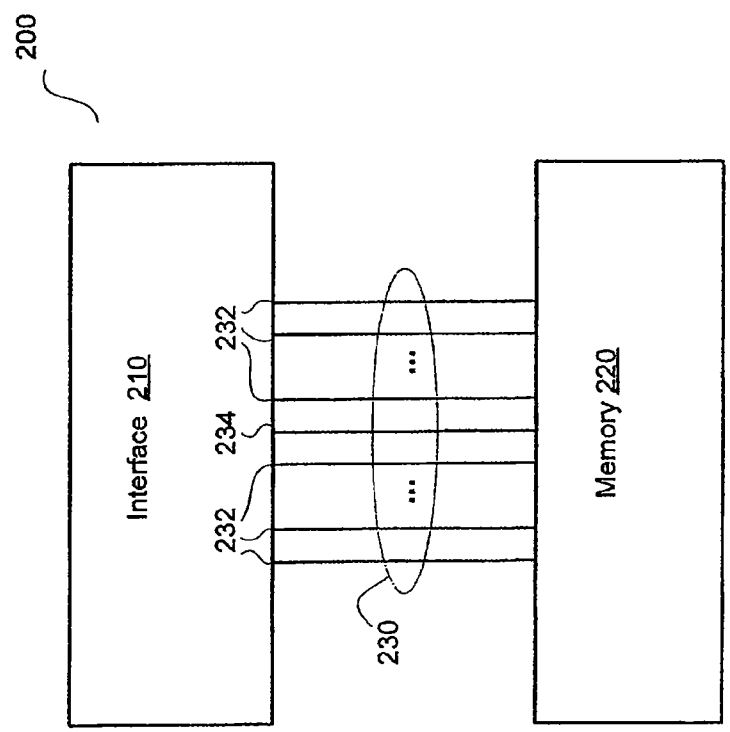
FIG. 2 is a block diagram of a system including a DDR memory and a PLD that interfaces with the memory according to an embodiment of the present invention.
Figure 2A:
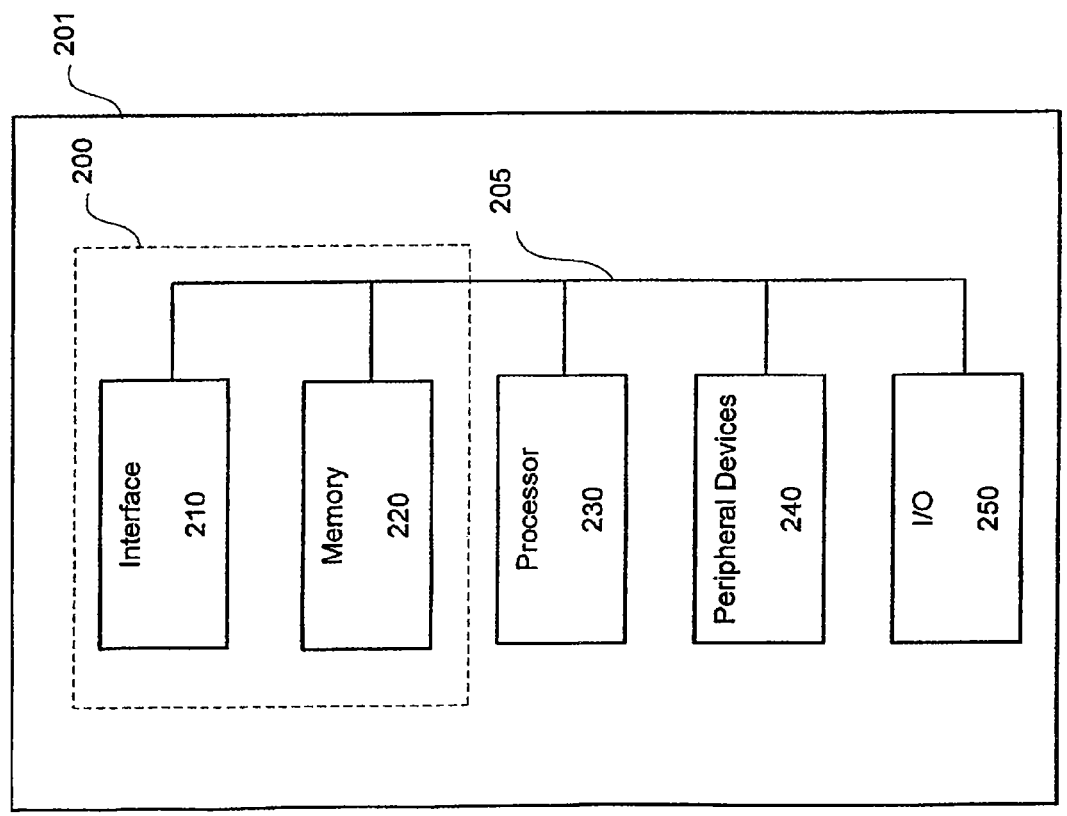

FIG. 2A is a block diagram of an exemplary system 200 including a memory interface circuit (interface) 210, and a multiple-data rate memory device 220, according to one embodiment of the present invention. System 200 may be part of a larger system 201, such as a data processing system, which may include one or more of the following components: a processor 230, peripheral devices 240, and input/output (I/O) device(s) 250, in addition to the components in system 200. The above components in system 201 are coupled together by a system bus 205. System 201 can be used in a wide variety of applications, such as computer networking, data networking, instrumentation, video processing, digital signal processing, or any other application that requires reading and writing data to and from the memory 220.

In this example, memory device 220 may be a double-data rate memory device (e.g., a DDR SDRAM device) that sends or receives a data group of n (e.g., n=8, 16, 32, 64, etc.) DQ data signals with each DQS signal. The number n is often referred to as the data width of the memory device 220. For some memories, there may be one or more parity bits in each data group. These parity bits are not real data, but are used for error-checking. Because of the parity bits, there may be an odd number of DQ data signals in each data group.

As shown in FIG. 2B, system 200 further includes groups of interconnect lines 230 between memory device 220 and interface 210, each group of interconnect lines 230 including n DQ data lines 232 bundled with a DQS strobe line 234 for routing the respective DQ and DQS signals between the memory 220 and the interface 210. Since the DQS signal is routed together with the DQ signals in the same group of interconnect lines 230, the timing skew between DQS and DQ caused by the interconnect lines is minimized.

Figure 4:
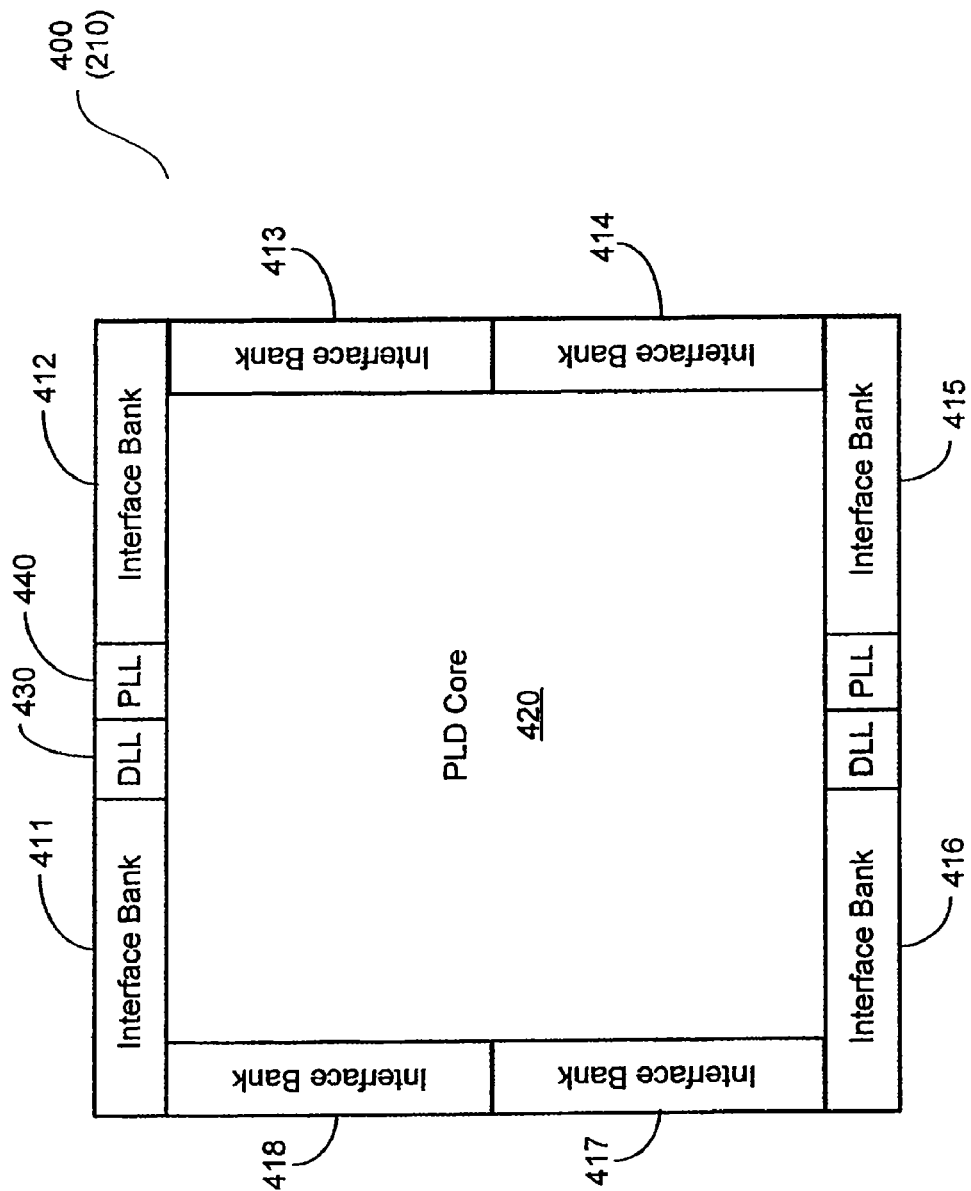
FIG. 4 is a block diagram illustrating a layout architecture for a PLD according to one embodiment of the present invention.

In one embodiment of the present invention, interface 210 is implemented using a PLD that may be configured to perform one of many user-defined functionalities such as a memory controller, microprocessor, digital signal processor, network processor, or the like. FIG. 4 shows a simplified layout architecture for the PLD according to one embodiment of the present invention. As shown in FIG. 4, the PLD includes an integrated circuit die 400, having a plurality of memory interface banks (banks) 411 through 418 and a PLD core 420. The banks 411-418 are placed in pairs along each edge of the PLD die 400 and are connected to PLD core 420. Depending on particular implementations, PLD 400 may also include one or more delay-locked-loop (DLL) circuits 430 and/or one or more phase-locked-loop (PLL) circuits 440 that are shared by various combinations of banks 411 through 418. For example, the pair of banks 411 and 412 along one edge of the die 400 could share a DLL circuit 430 near the same edge of the die 400.

PLD core 420 may be implemented using a variety of different architectures. It is to be understood, however, that the invention is not limited to a particular type of PLD architecture, and that the modular multiple-data-rate I/O architecture of the present invention can be utilized in any type of programmable logic device, many variations of which are described in data books published by Altera Corporation, and in particular those relating to the Armstrong™ PLD family.

Figure 5:
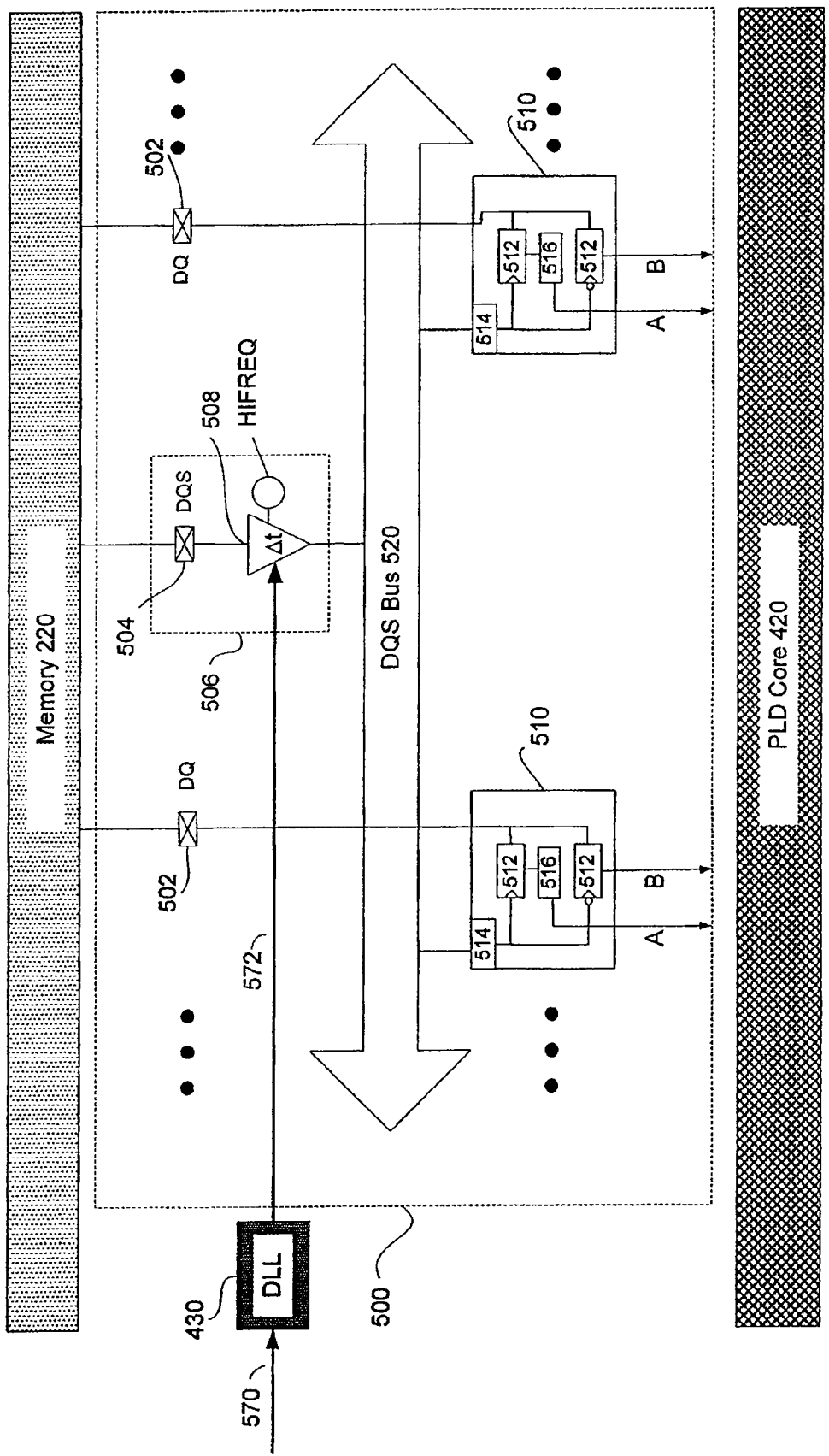
FIG. 5 is a block diagram of an I/O module in the PLD according to one embodiment of the present invention.

FIG. 5 illustrates part of an I/O module 500 in a bank, such as bank 411, of the PLD die 400 according to one embodiment of the present invention. Data arriving at the PLD 400 from the memory 220 is considered Read Data. Data sent to the memory 220 from the PLD 400 is considered Write Data. For ease of illustration, only components for read operations in the I/O module 500 are shown in FIG. 5. As shown in FIG. 5, I/O module 500 includes a plurality of DQ pins 502, and one or more strobe circuits 506, each including a DQS pin 504 and a phase-shift circuit 508 coupled to the DQS pin 504. DQ pins 502 are configured to receive the DQ signals from respective DQ lines 232, and DQS pins 504 are configured to receive the DQS signals from respective DQS lines 234. For most memory standards, the DQ pins 502 are bi-directional, meaning that the DQ pins 502 are configured to receive Read Data from the memory 220 and to transmit Write Data to the memory 220. For some memory standards, the DQ pins 502 are uni-directional, meaning that there are independent DQ pins for Read Data and Write Data.

Like the DQ pins 502, the DQS pins 504 are bi-directional for some memory standards, meaning that they are used to receive read strobe signals from memory 220 during a read operation and to send write strobe signals to memory 220 during a write operation. Some memory standards require unidirectional read strobes and write strobes. In these cases, the DQS pins 504 are used as read strobes, and additional outputs (not shown) are used as write strobes. Also, depending on the memory standards, there are a number n (e.g., n=8, 16, 32, 64, etc.) of DQ pins 502 associated with each DQS pins. Each DQ pin 502 associated with a DQS 504 pin is connected to a different one of the n DQ data lines 232 bundled with a DQS strobe line 234 that is connected to the DQS pin.

Figure 3:
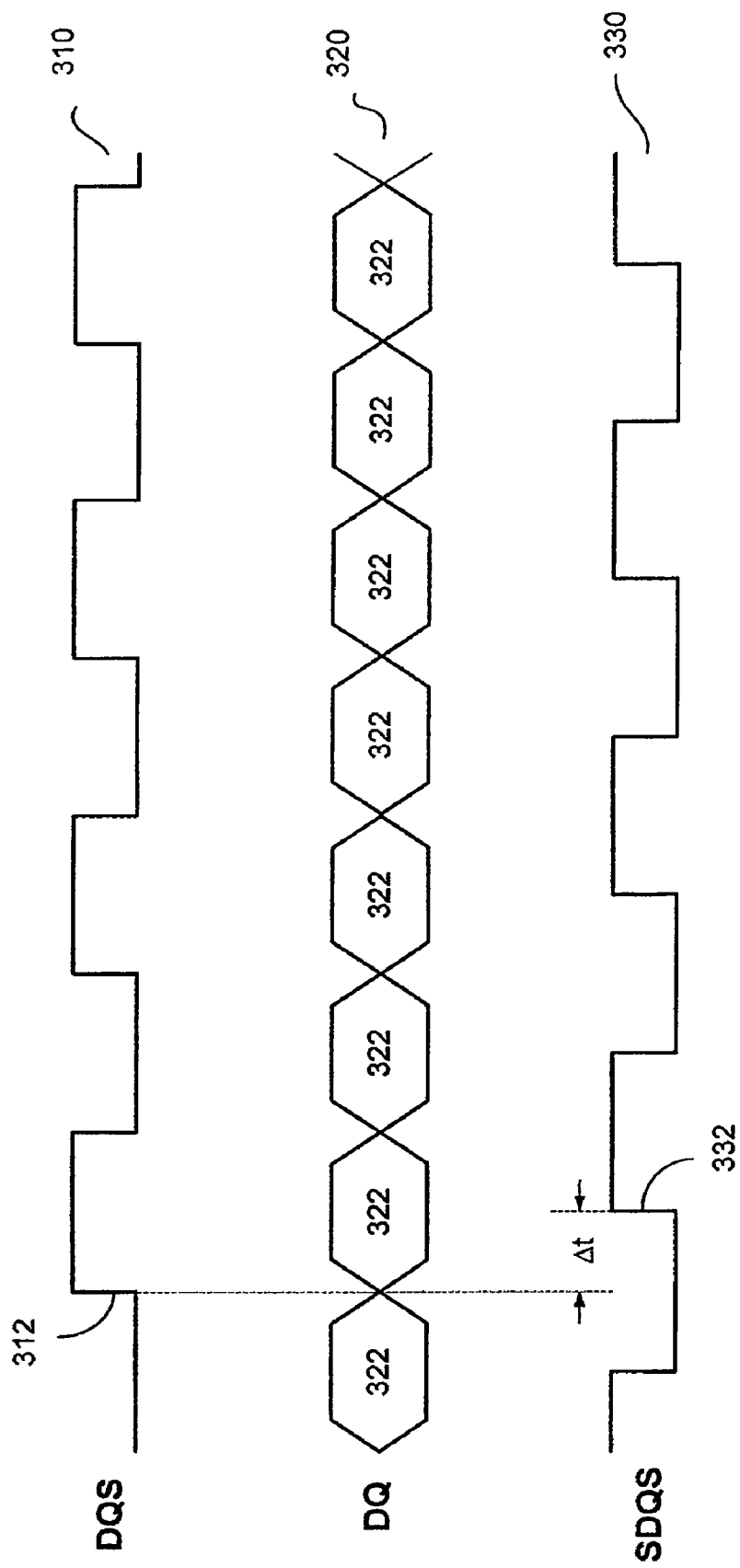
FIG. 3 is a timing diagram illustrating a timing relationship between data signals (DQ) and data strobe signal (bQS) from the DDR memory.

FIG. 3 shows a timing relationship between a DQS signal 310 and associated DQ signals 320 when they arrive at the DQS pins 504 and DQ pins 502 of the PLD 210 during a read operation. As shown in FIG. 3, DQS pulses 312 in the DQS signal 310 arriving at the PLD 210 are normally edge-aligned with DQ pulses 322 in the associated DQ signals 320. For optimum sampling of the data, delay circuit 508 delays the DQS signal 310 by, for example, ¼ of the clock period, to produce a delayed_DQS signal (SDQS) 330 so that there is a certain degree (e.g., 90 degree) phase shift between the edges of DQ pulses 322 and delayed_DQS pulses 332. This phase shift helps to place the edges of delayed-DQS pulses 332 as close to the center of the DQ pulses 322 in the DQ signals 320 as possible, as shown in FIG. 3.

Referring again to FIG. 5, I/O module 500 further includes DDR register blocks 510 that are configured to capture the data received by respective ones of the DQ pins 502. Thus, each DDR register block 510 includes at least two input registers 512 that are connected to a DQ pin 502 either directly or through one or more I/O buffers (not shown). Each DDR register block (hereafter referred to as register block) 510 further includes a clock input 514 configured to receive a clock signal that times the capture of the DDR Read Data DQ on opposite edges of the clock signal. During a read operation, the DQ signals received by the DQ pins 502 associated with a DQS pin 504 are transmitted to respective ones of the group of register blocks 510. The DQS signal received by the DQS pin 504 is delayed by going through the phase-shift circuit 508 before arriving at a DQS bus 520.

A conventional delay circuit can be used as the delay circuit 508. Alternatively, the delay circuit described in copending and co-owned patent application, U.S. application Ser. No. 10/857,221, which is incorporated herein by reference, may be used. Since typical phase shift techniques in a delay circuit are highly susceptible to process, voltage, and temperature (PVT) variations, a DLL circuit 430 is used to adjust to these variations. The DLL circuit 430 receives a system clock signal via a line 570 and provides a set of control bits, such as control bits Ct[5:0] to the phase-shift circuit 508 via a bus 572, as shown in FIG. 5. The system clock signal can be generated in the PLD 210 or elsewhere in the system 201. A conventional DLL circuit can be used to as the DLL circuit 430. Alternatively, the DLL circuit described in the above referenced copending and co-owned patent application may be used. The DLL circuit 430 receives a system clock signal via a line 570 and provides a set of control bits to the phase-shift circuit 508 via a bus 572, as shown in FIG. 5.

The DQS bus 520 is configured to route the delayed DQS signal to the clock inputs 514 of the register blocks 510 connected to the DQ pins 502 associated with the DQS pin 504. The delayed DQS signal serves as the clock signal that times the capture of the Read Data in the DQ signals by the register blocks 510. In the DDR implementation, the data are captured at both the rising edges and falling edges of the DQS signal and are sent as data output signals from each register block 510 to the PLD core 420 via lines A and B. Depending on specific configurations of the I/O module 500, as explained in more detail below, the DQS bus 520 may route multiple DQS signals from multiple DQS pins 504 so that the DQS signal from each of the multiple DQS pins 504 is fed to a group of register blocks 510 that are connected to the DQ pins 502 associated with the DQS pin 504.

There are other delays inherent in the routing of the DQS signal from the strobe circuit 506 through the DQS bus 520 to the clock inputs 514 of the register blocks 510. These inherent delays may cause undesirable skews between the DQS signal and the associated DQ signals, especially when the group of register blocks 510 is large in number and located at varying distances from the output of the delay circuits 508. Therefore, the present invention includes a DQS bus 520 having a balanced tree structure for minimizing the skews between the DQS signal and the associated DQ signals.

Figure 6:
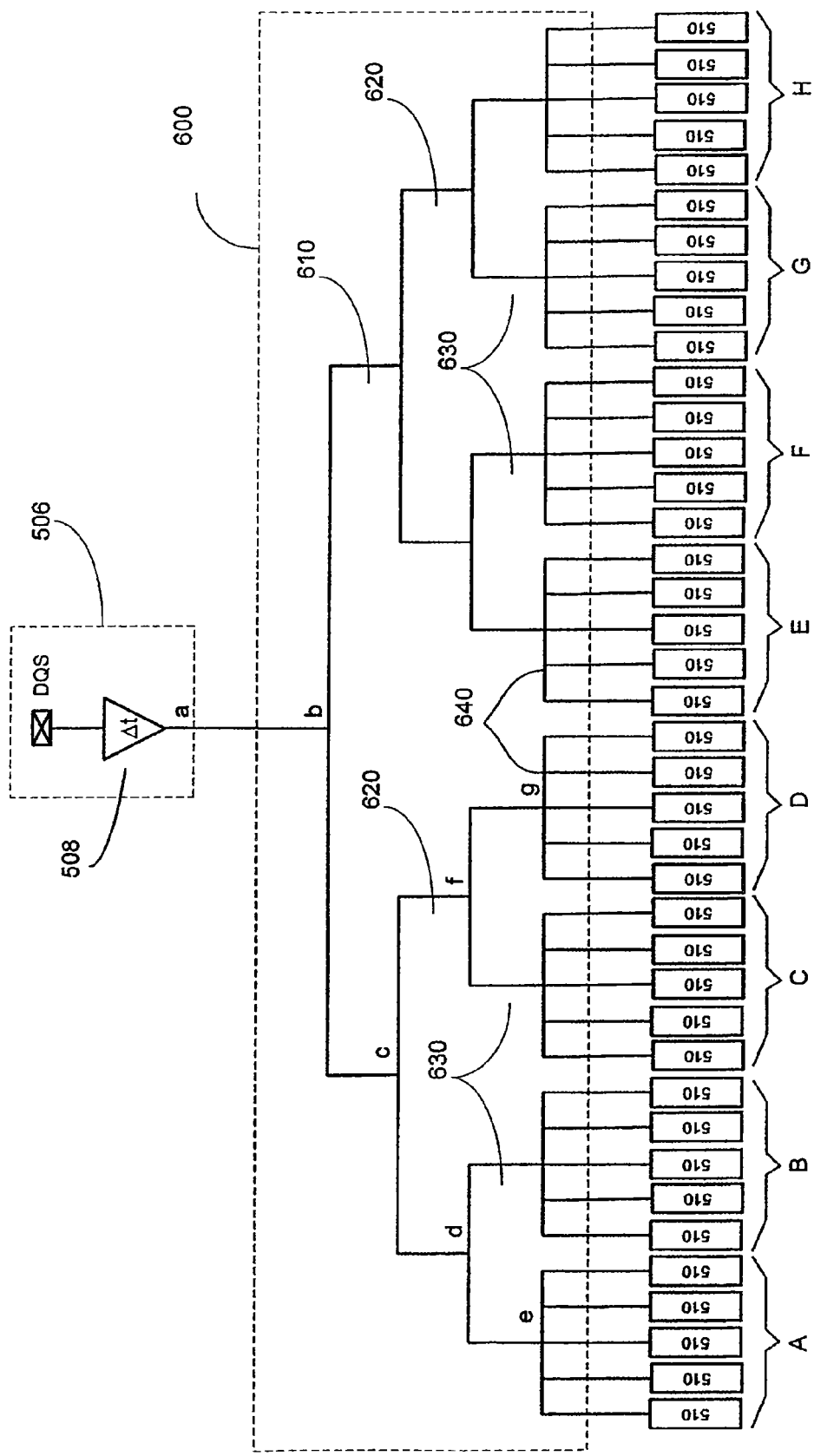
FIG. 6 is a diagram of a DQS bus structure in I/O module according to one embodiment of the present invention.

FIG. 6 is a block diagram of a balanced tree structure 600 in the DQS bus 520 according to one embodiment of the present invention. As shown in FIG. 6, when the number of DQ pins 502 associated with a DQS pin 504 is large in number, e.g., n is 8 or larger, the register blocks 510, to which DQ pins 502 are connected, are divided into groups, such as groups A through H shown in FIG. 6. The multiple groups of register blocks 510 are then connected through the tree structure 600 having at least two stages of signal tracks branching off from the delay circuit 508 connected to the DQS pin 504. In the example shown in FIG. 6, the at least two stages of signal tracks includes a first stage signal track 610, two second stage signal tracks 620, four third stage signal tracks 630, and eight fourth stage signal tracks 640. For ease of illustration, each signal track is drawn in FIG. 6 to have a π shape. But in practice, the signal tracks can have different shapes depending on specific layout requirements. Whatever the shapes of the signal tracks, each signal track has two ends and a mid-point selected such that the lengths of the portions of the signal track between the mid-point and the two ends are about equal. Also, each signal track may include one or more conductive lines and one or more devices such as inverters and multiplexers.

As shown in FIG. 6, each group of register blocks 510 is connected to a respective one of the lowest stage signal tracks, which in this example is one of the fourth stage signal tracks 640. So, instead of using one metal track that stretches across all of the fixed number of register blocks 510, a shorter signal track 640 is used to stretch across each group of register blocks 510. To minimize skews, structure 600 is further configured to balance the signal paths from the delay circuit 508 to the different groups of register blocks 510 by minimizing the differences between the lengths of the signal paths. In the example shown in FIG. 6, to accomplish such balance, the output of the strobe circuit 508 is connect to a mid-point 611 of the first stage signal track 610, whose two ends 612 contact respective ones of the two second stage signal tracks 620 at their mid-points 621. Furthermore, each second stage signal track 620 has two ends 622 that contact respective ones of an adjacent pair of third stage signal tracks 630 at their mid-points 631, as shown in FIG. 6. Moreover, each third stage signal track 630 has two ends 632 that contact respective ones of an adjacent pair of fourth stage signal tracks 640 at their mid-points 641, the fourth stage metal track stretching between its two ends 642 across a group of register blocks 510.

Thus, the lengths of signal paths from the DQS circuit 508 to the different groups of register blocks are about equal. For example, the length of a signal path from the delay circuit 508 to the center point 641 of the signal track 640 across group A of register blocks, i.e., the signal path running from point a to point b to point c to point d to point e in structure 600, is about equal to the length of a signal path from the delay circuit 508 to the center point 641 of the signal track 640 across subgroup B of register blocks, i.e., the signal path running from point a to point b to point d to point f to point g in the balanced tree structure 600. Since the differences in the lengths of signal paths from the delay circuit 508 to the subgroups of register blocks 510 are minimized, the differences in the delays between the DQS signals and the DQ signals received by the group of register blocks 510 are minimized. In other words, the balanced signal paths result in a uniformity among the inherent delays caused by the routing of the DQS signal thorough the DQS bus 520 to the different subgroups of register blocks. Therefore, a desired uniform delay between the DQS signals and the DQ signals can be accomplished by adjusting the settings in the delay circuit 508.

Although FIG. 6 shows that each group of register blocks includes 5 register blocks, the number of register blocks in a group can range from 2 to an arbitrary number m of register blocks. This arbitrary number is preferably small, e.g., $m \leq 10$, so as to limit the amount of skew between the delayed-DQS signal and the DQ signals received at different register blocks within the group.

Figure 7:
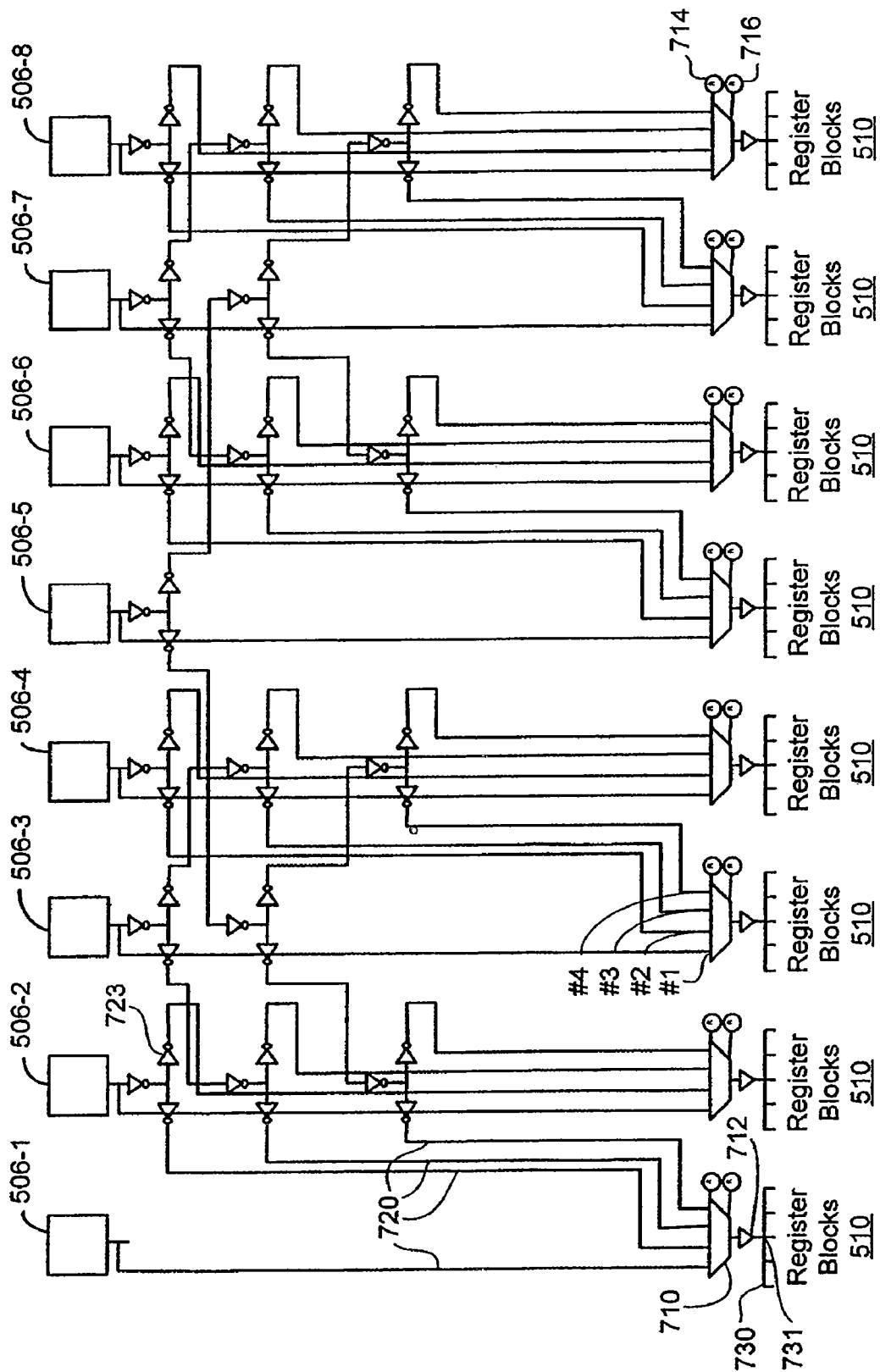
FIG. 7 is a diagram of a DQS bus structure in I/O module according to an alternative embodiment of the present invention.

FIG. 7 is a block diagram of an example of a configurable balanced tree network 700 in the DQS bus 520 according to an alternative embodiment of the present invention. Tree network 700 is coupled on one side to a plurality of strobe circuits, such as strobe circuits 506-1 through 506-8, and on another side to a fixed number of register blocks grouped in groups A through H each having two or more, such as five, register blocks 510 connected to a metal track 730 associated with the group. As shown in FIG. 7, tree network 700 includes a plurality of selection devices 710 each having an output 712 coupled to a mid-point 731 of the metal track 730 associated with a group of register blocks 510. Each selection device 710 also includes two or more inputs, such as inputs #1, #2, #3, #4 shown in FIG. 7, that are coupled through respective signal tracks 720 to respective ones of two or more strobe circuits 506-1, 506-2, . . . , and/or 506-8. Each signal track 720 runs from a strobe circuit to an input of a selection device and may include one or more conductive lines and devices such as pairs of inverters 723 for squaring (sharpening) up the delayed DQS signal. Each selection device 710 also includes one or more configuration bits, such as configuration bits 714 and 716, which can be configured to select one of the two or more strobe circuits connected to the inputs of the selection device for producing the delayed DQS signal to the group of register blocks coupled to the selection device.

Thus, depending on specific configuration of the selection devices 710, the DQS bus may route DQS signals from one, two, four, or eight strobe circuits to a number of register blocks 510. Also, depending on the specific configuration of the selection devices 710, different combinations from the number of register blocks can be associated with a selected DQS circuit. Thus, tree network 700 can be configured to interface with memories having different data widths. For example, as shown in FIG. 7, when the selection devices 710 are configured such that input #1 of each of the selection devices 710 is selected to be connected to output 712 of the selection device 710, each strobe circuit in FIG. 7 is selected to be connected to a different group of register blocks 510, and the tree network is thus configured to accommodate a memory width that is equal or less than 5-bits wide. Alternatively, when the selection devices 710 are configured such that input #2 of each of the selection devices 710 is selected to be connected to output 712 of the selection device 710, every other strobe circuit in FIG. 7 is selected to be connected to a different pair of groups of register blocks 510 (i.e., strobe circuit 506-2 is connected to groups A and B, strobe circuit 506-4 is connected to groups C and D, strobe circuit 506-6 is connected to groups E and F, and strobe circuit 506-8 is connected to groups G and H). Tree network 700 thus configured is suitable for a memory width that is equal or less than 10-bits wide.

Furthermore, when the selection devices 710 are configured such that input #3 of each of the selection devices 710 is selected to be connected to output 712 of the selection device 710, only two of the strobe circuits 506-3 and 506-7 in FIG. 7 are selected to be connected to groups A-D and groups E-H, respectively. Since each of the two selected strobe circuits 506-3 and 506-7 is connected to four different groups of register blocks, tree network 700 thus configured is suitable for a memory width that is equal or less than 20-bits wide. Moreover, when the selection devices 710 are configured such that input #4 of each of the selection devices 710 is selected to be connected to the output 712 of the selection device 710, only one of the strobe circuits 506-5 in FIG. 7 is selected to be connected to all of groups A-H of the register blocks 510 in the figure, and tree network 700 thus configured is suitable for a memory width that is equal or less than 40-bits wide. Notice that the interconnect lines 720 in the tree network 700 are balanced such that when a strobe circuit is selected to provide strobe signals to two or more groups of register blocks 510, the lengths of the signal paths from the selected strobe circuit to the mid-points 731 of the metal tracks 730 associated with the two or more groups of register blocks are about equal.

Figure 8:
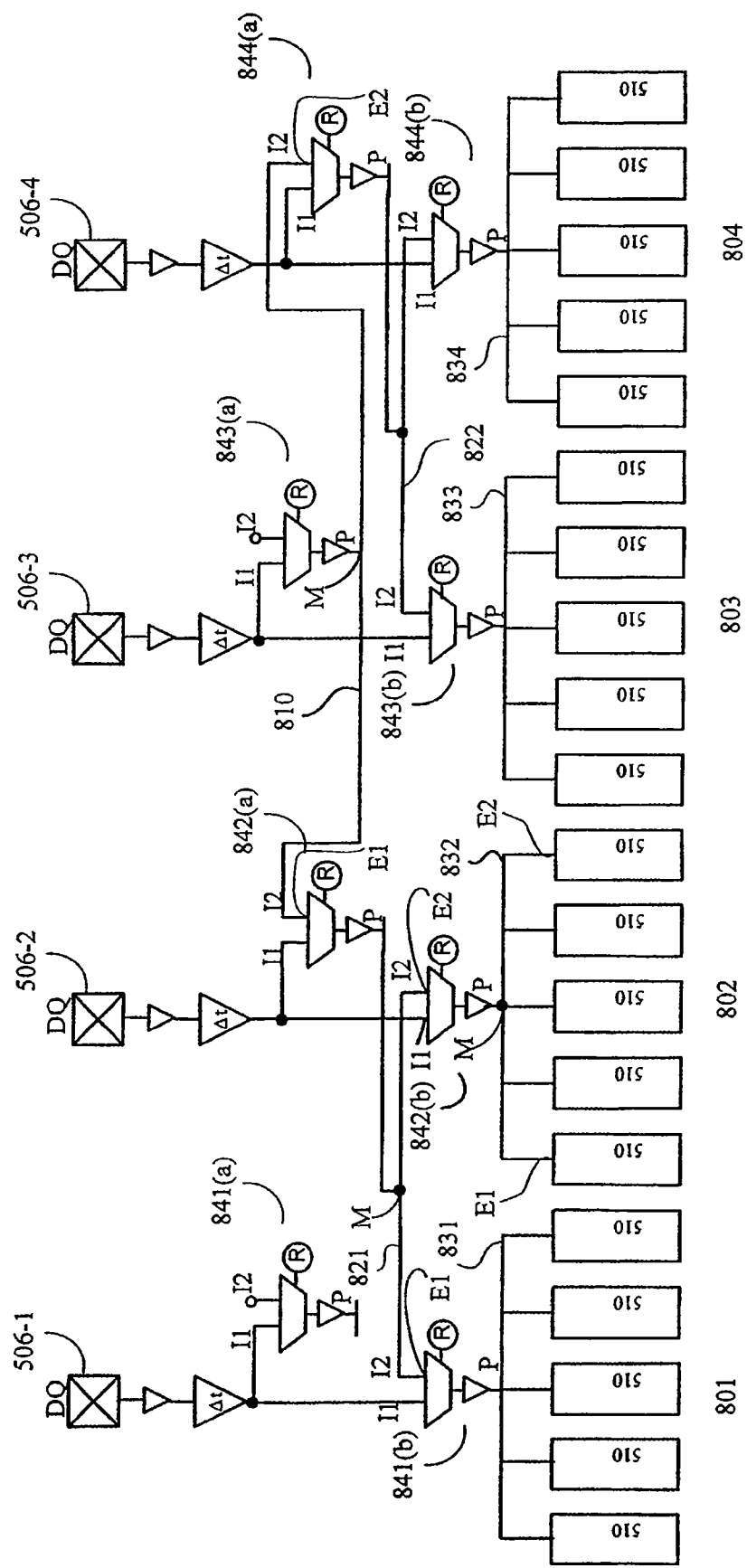
FIG. 8 is a diagram of a DQS bus structure in I/O module according to another alternative embodiment of the present invention.

FIG. 8 is a block diagram of an example of a configurable balanced tree network 800 in the DQS bus 520 according to yet another embodiment of the present invention. Like tree network 700, tree network 800 can be configured to accommodate memory devices having different data widths. As shown in FIG. 8, tree network 800 can be configured to route DQS signals from up to 4 strobe circuits, such as strobe circuits 506-1 through 506-4, to a number of register blocks 510. The register blocks 510 are divided into groups of two or more, such as five, register blocks 510, such as groups 801 through 804 shown in FIG. 8. The multiple groups of register blocks 510 are then connected through the tree network 800 having different stages of signal tracks forming a network of tree structures. In the example shown in FIG. 8, the different stages of signal tracks includes a signal track 810, signal tracks 821 and 822, and signal tracks 831 through 834. The shapes of the signal tracks shown in FIG. 8 are for illustrative purposes. In practice, the signal tracks can have different shapes from those shown in FIG. 8 depending on specific layout requirements. Whatever the shapes of the signal tracks, each signal track has two ends E1 and E2 and a mid-point M selected such that the lengths of the portions of the signal track between M and the two ends E1 and E2 are about equal.

As shown in FIG. 8, tree network 800 further includes selection devices 841(a)-844(a) and 841(b)-844(b), each having a first input I1, a second input I2, an output P, and a configuration bit R that can be set so that a selected one of input A and input B is connected to output P. In this example, input I1 of each of the selection devices 841(a)-844(a) and 841(b)-844(b) is connected either directly or through I/O buffers or other devices to one of the strobe circuits 506-1 through 506-4, input I2 of each of the selection devices is either driven to a static voltage (such as $V_{CC}$ or $V_{SS}$) or connected to an end of one of the signal tracks 810, 821 and 822, and output P of each of the selection devices is either left open or connected to a mid-point of one of the signal tracks 810, 821, 822, and 831-834.

Specifically:
- selection device 841(*a*) has input I1 connected to strobe circuit 506-1, input I2 left open, and output P left open;
- selection device 841(*b*) has input I1 connected to strobe circuit 506-1, input I2 connected to end E1 of signal track 821, and output P connected to mid-point M of signal track 831, which stretches across and connects the I/O register blocks 510 in group 801;
- selection device 842(*a*) has input I1 connected to strobe circuit 506-2, input I2 connected to end E1 of signal track 810, and output P connected to mid-point M of signal track 821;
- selection device 842(*b*) has input I1 connected to strobe circuit 506-2, input I2 connected to end E2 of signal track 821, and output P connected to mid-point M of signal track 832, which stretches across and connects the I/O register blocks 510 in group 802;
- selection device 843(*a*) has input I1 connected to strobe circuit 506-3, input I2 left open, and output P connected to mid-point M of signal track 810;
- selection device 843(*b*) has input I1 connected to strobe circuit 506-3, input I2 connected to end E1 of signal track 822, and output P connected to mid-point M of signal track 833, which stretches across and connects the I/O register blocks 510 in group 803;
- selection device 844(*a*) has input I1 connected to strobe circuit 506-4, input I2 connected to end E2 of signal track 810, and output P connected to mid-point M of signal track 822; and
- selection device 844(*b*) has input I1 connected to strobe circuit 506-4, input I2 connected to end E2 of signal track 822, and output P connected to mid-point M of signal track 834, which stretches across and connects the I/O register blocks 510 in group 804.

Thus, depending on the specific configuration of the selection devices 841(*a*)-844(*a*) and 841(*b*)-844(*b*), the DQS bus 800 may route DQS signals from one, two, or four strobe circuits to a number of register blocks 510 coupled to the tree network 800. Also depending on the specific configuration of the selection devices, different combinations of groups 801-804 of register blocks can be associated with respective ones of a selected number DQS circuits 506 to accommodate different memory data widths. For example, as shown in FIG. 8, when the selection devices 841(*b*)-844(*b*) are configured such that input I1 of each of these selection devices is selected to be connected to output P of the selection device, each strobe circuit 506-1 through 5064 in FIG. 8 is selected to be connected to a different group of register blocks 510, and the tree network is thus configured to accommodate a memory width equal or less than 5-bits wide. Alternatively, when the selection devices 841(*b*)-844(*b*) are configured such that input I2 of each of these selection devices is selected to be connected to output P of the selection device, and when the selection devices 842(*a*) and 844(*a*) are configured such that input I1 of each of these selection device is selected to provide strobe signals to output P of the selection device, strobe circuit 506-2 is selected to be connected to the register blocks 510 in groups 801 and 802, and strobe circuit 506-4 is selected to provide strobe signals to the register blocks 510 in groups 803 and 804. Tree network 800 is thus configured to accommodate a memory width equal or less than 10-bits wide.

Furthermore, when the selection devices 841(*b*)-844(*b*) and selection devices 842(*a*) and 844(*a*) are configured such that input I2 of each of these selection devices is selected to be connected to output P of the selection device, only strobe circuit 506-3 in FIG. 8 is selected to provide strobe signals to the register blocks 510 in all of groups 801-804 in the figure. Tree network 800 is thus configured to accommodate a memory width equal or less than 20-bits wide. Note that the tree network 800 is balanced such that when a strobe circuit is selected to provide strobe signals to two or more groups of register blocks 510, the lengths of the signal paths from the selected strobe circuit to the mid-points M of the signal tracks each connecting one of the two or more groups of register blocks are about equal. The selection devices in tree network 700 or 800 can be implemented using configurable multiplexers (or muxes).

Figure 9:
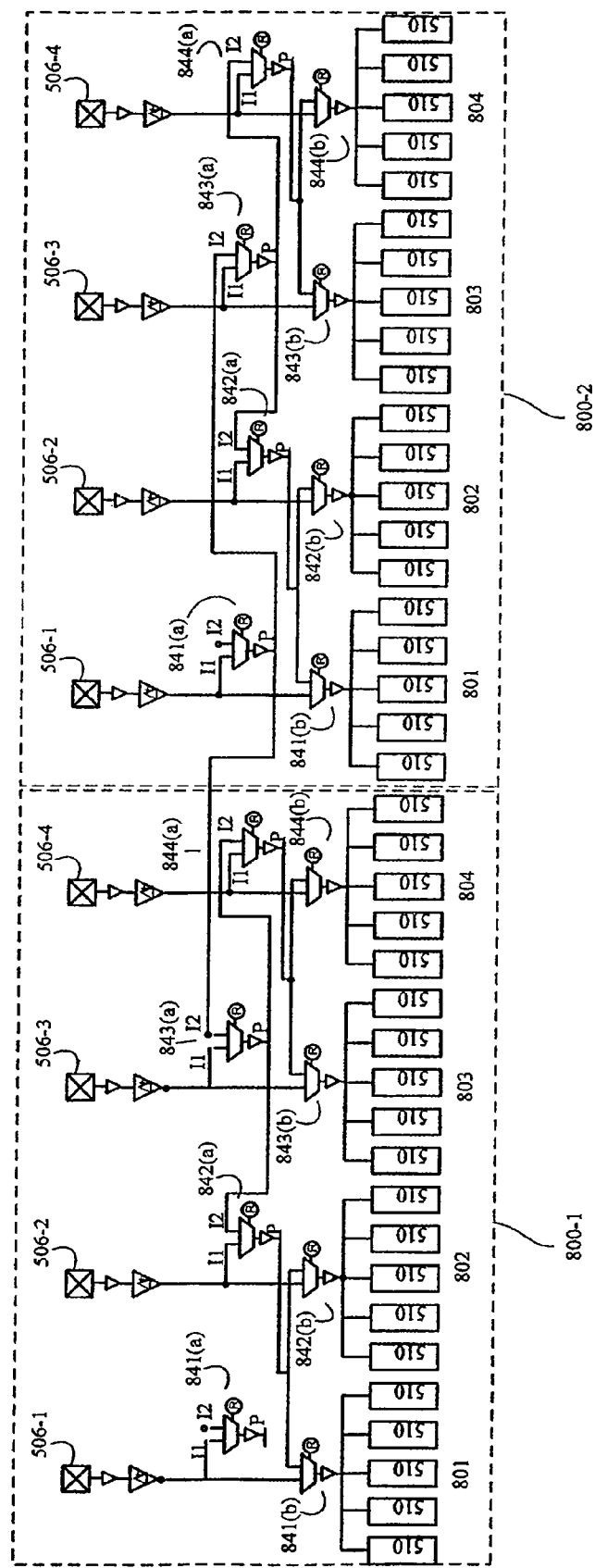
FIG. 9 is a diagram illustrating a combination of two DQS bus structures shown in FIG. 8.

Note also that selection devices 841(*a*) and 843(*a*) can be left out so that inputs I2 of selection devices 842(*a*) and 844(*a*) are directly connected to the output of the strobe circuit 506-3. However, if selection devices 841 and 843 are included, they can be used when more than one tree network 800, such as 800-1 and 800-2 shown in FIG. 9, are combined to form a larger tree network 900 that can be configured to accommodate even wider memory widths. As shown in FIG. 9, tree network 900 includes tree networks 800-1 and 800-2, which are similar to tree network 800, wherein input I2 of selection device 843(*a*) in tree network 800-1 and input I2 of selection device 843(*a*) in tree network 800-2 are connected to output P of selection device 841(*a*) in tree network 800-2. Thus, when the selection devices 841(*b*) through 844(*b*), and selection devices 842(*a*) through 844(*a*) in each of tree networks 800-1 and 800-2 are configured such that input I2 of each of these selection devices is selected to be connected to output P of the selection device, only strobe circuit 506-1 in tree network 800-2 is selected to provide strobe signals to the register blocks connected to tree network 900. Tree network 900 is thus configured to accommodate a memory width equal or less than 40-bits wide.

The above examples of the I/O module 500 in the PLD 210 are for illustrative purposes only. Many different variations and alternatives are possible. For example, the number of DQ pins, DQS pins, or register blocks in each module 500 may vary depending on specific applications. In some embodiments, the module 500 may include non-DDR I/O registers, such as some general-purpose I/O registers in addition to the DDR I/O register blocks to add further flexibility. In a variation of this embodiment, where all DQ pins and DQS pins are identical, each DQS pin 504 can be configured to connect to a phase shift circuit 508 (in case of a DDR application), or alternatively to a register block. Thus the DQS pins not used to receive DQS signals can be used as DQ pins. In applications with higher data rates (e.g., quad data rate), each DDR register block 510 may include more than two (e.g., four) I/O registers.

We claim:

1. An integrated circuit comprising interface circuitry, the interface circuitry comprising:
    a plurality of strobe circuits;
    a plurality of groups of register blocks, each register block including at least one register;
    a first set of selection devices, each having at least two inputs, including a first input and a second input, and an output that is coupled to a respective group of register blocks; and
    a second set of selection devices, each having at least two inputs, one of which is coupled to an output of one of the plurality of strobe circuits, and an output that is connected to the second inputs of at least two of the first set of selection devices;
    wherein each selection device can select one of its at least two inputs to be connected to the output.

2. The integrated circuit of claim 1 wherein each of the first set of selection devices is coupled to a group of register blocks through an interconnect that is balanced such that lengths of signal paths from an output of the selection device to at least two of the register blocks are about equal.

3. The integrated circuit of claim 1 wherein the inputs of the first set of selection devices and the second set of selection devices can be selected either such that one of the plurality of strobe circuits provides a strobe signal to each of the plurality of groups of register blocks, such that one of the plurality of strobe circuits provides a strobe signal to one-half of the plurality of groups of register blocks, or such that one of the plurality of strobe circuits provides a strobe signal to one of the plurality of groups of register blocks.

4. A memory interface comprising:
a plurality of strobe circuits;
a plurality of selection devices, each having an input coupled to an output of one of the plurality of strobe circuits; and
a plurality of groups of register blocks, each register block including at least one register;
wherein each group of register blocks is coupled to one of the plurality of selection devices such that one selection device selects one of the plurality of strobe circuits for providing a data strobe signal to the group of register blocks coupled to the selection device, and such that each of the other selection devices can be programmed to select from more than one of the plurality of strobe circuits for providing a data strobe signal to the group of register blocks coupled to the selection device.

5. The memory interface of claim 4 wherein each selection device is a multiplexer configurable by setting at least one configuration bit in the memory interface.

6. The memory interface of claim 4 wherein the plurality of selection devices comprises:
a first set of selection devices each having at least two inputs, including a first input and a second input, and an output that is coupled to a respective group of register blocks; and
a second set of selection devices each having at least two inputs, one of which is coupled to a respective one of the plurality of strobe circuits, and an output that is connected to the second inputs of at least two of the first set of selection devices;
wherein each selection device can be configured to select one of its at least two inputs to be connected to the output.

7. The memory interface of claim 6 wherein the first input of each of the first set of selection devices is connected to a respective one of the plurality of strobe circuits.

8. The memory interface of claim 6 wherein another one of the at least two inputs of one of the second set of selection devices is connected to a strobe circuit through a different one of the second set of selection devices.

9. The memory interface of claim 6 wherein another one of the at least two inputs of one of the second set of selection devices is connected to a strobe circuit through two different ones of the second set of selection devices.

10. The memory interface of claim 6 wherein each selection device is a multiplexer configurable by setting a configuration bit in the memory interface.

11. The integrated circuit of claim 6 wherein each of the first set of selection devices is coupled to a group of register blocks through an interconnect that is balanced such that lengths of signal paths from an output of the selection device to at least two of the register blocks are about equal.

12. The integrated circuit of claim 6 wherein the inputs of the first set of selection devices and the second set of selection devices can be selected either such that one of the plurality of strobe circuits provides a strobe signal to each of the plurality of groups of register blocks, such that one of the plurality of strobe circuits provides a strobe signal to one-half of the plurality of groups of register blocks, or such that one of the plurality of strobe circuits provides a strobe signal to one of the plurality of groups of register blocks.

13. The memory interface of claim 4 wherein the register blocks are double data-rate register blocks.

14. The memory interface of claim 4 wherein each strobe circuit includes a strobe pin and a phase delay circuit.

15. An integrated circuit comprising:
a plurality of strobe circuits;
a plurality of selection devices, each having an input coupled to an output of one of the plurality of strobe circuits;
a plurality of groups of register blocks, a clock input for each register block in a group of register blocks coupled to an output of one of the selection circuits,
wherein the plurality of selection devices can be programmed either such that one of the plurality of strobe circuits provides a strobe signal to each of the plurality of groups of register blocks, such that one of the plurality of strobe circuits provides a strobe signal to one-half of the plurality of groups of register blocks, or such that one of the plurality of strobe circuits drives one of the plurality of groups of register blocks.

16. The integrated circuit of claim 15 wherein each group of register blocks is coupled to one of the plurality of selection devices such that one selection device selects one of the plurality of strobe circuits for providing a data strobe signal to the group of register blocks coupled to the selection device, and such that each of the other selection devices can be programmed to select from more than one of the plurality of strobe circuits for providing a data strobe signal to the group of register blocks coupled to the selection device.

17. The integrated circuit of claim 15 wherein each strobe circuit includes a strobe pin and a phase delay circuit.

18. The integrated circuit of claim 15 wherein each register block comprises a double data-rate register.

19. The memory interface of claim 15 wherein the plurality of selection devices comprises:
a first set of selection devices each having at least two inputs, including a first input and a second input, and an output that is coupled to a respective group of register blocks; and
a second set of selection devices each having at least two inputs, one of which is coupled to a respective one of the plurality of strobe circuits, and an output that is connected to the second inputs of at least two of the first set of selection devices.

20. The integrated circuit of claim 19 wherein each of the first set of selection devices is coupled to a group of register blocks through an interconnect that is balanced such that lengths of signal paths from an output of the selection device to at least two of the register blocks are about equal.

* * * * *